US006662070B1

United States Patent
Conboy et al.

(10) Patent No.: US 6,662,070 B1
(45) Date of Patent: Dec. 9, 2003

(54) WAFER ROTATION RANDOMIZATION IN CLUSTER TOOL PROCESSING

(75) Inventors: Michael R. Conboy, Austin, TX (US); Sam H. Allen, Jr., New Braunfels, TX (US); Russel Shirley, Pflugerville, TX (US); Elfido Coss, Jr., Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/520,483

(22) Filed: Mar. 8, 2000

(51) Int. Cl.[7] .............................................. G06F 19/00
(52) U.S. Cl. ..................... 700/121; 700/110; 438/14
(58) Field of Search ............................ 700/56–58, 61, 700/62, 64, 108, 109, 110, 112, 115, 121, 219, 225; 702/151; 438/5, 14

(56) References Cited

U.S. PATENT DOCUMENTS

| | | | |
|---|---|---|---|
| 5,716,856 A | * 2/1998 | Lin et al. ........................ 438/14 |
| 5,842,825 A | * 12/1998 | Brooks ......................... 414/754 |
| 5,940,300 A | * 8/1999 | Ozaki ........................... 700/121 |
| 6,161,054 A | * 12/2000 | Rosenthal et al. ........... 700/121 |
| 6,180,424 B1 | * 1/2001 | Tigelaar et al. ................ 438/14 |
| 6,213,853 B1 | * 4/2001 | Gonzalez-Martin et al. 451/287 |
| 6,236,903 B1 | * 5/2001 | Kim et al. .................... 700/121 |
| 6,385,503 B2 | * 5/2002 | Volle ............................ 700/218 |

* cited by examiner

Primary Examiner—Leo Picard
Assistant Examiner—Paul Rodriguez

(57) ABSTRACT

The detection of a processing deviation in a cluster tool of a wafer processing system is achieved by assigning individual wafers a set of positional coordinates each time the wafer moves within the cluster tool. In an example embodiment, a wafer is placed into a first chamber of the cluster tool and it is rotated to a certain angle of rotation. Each time the wafer moves within the cluster tool the wafer is given a different angle of rotation; both the rotation angle and the wafer location are then recorded as a set of positional coordinates. The wafer exits the cluster tool and is examined for structural or surface defects that indicate that there was a variation in the processing parameters. A wafer movement map is developed from the positional coordinates and the map is then used as an analysis tool to identify the processing location that caused defect to occur. An important advantage is the increased control and traceability that the tracking method brings to single wafer handling and processing.

29 Claims, 5 Drawing Sheets

WAFER ROTATION RANDOMIZATION IN CLUSTER TOOL PROCESSING

FIELD OF THE INVENTION

The present invention generally relates to tracking the movement of wafers in a semiconductor processing plant and, more particularly, to methods and systems for single wafer processing and point to point tracking of the wafer in a multiple chamber process.

BACKGROUND OF THE INVENTION

Conventional manufacturing plants move material to be processed through a manufacturing process having several processing areas. Currently these material lots are tracked in larger quantities that may be disposed in a carrier for ease of movement throughout the facility.

Some manufacturing processes require that the item being processed be rotated regularly in order to ensure that the item is properly processed, such as when painting an object or when applying a coating to a substrate. In the case of a mechanical process, the object is rotated to ensure that the tooling is being worn evenly or that the tooling is mechanically treating the object evenly. Even though some of these items may be individually processed, or processed in small lots, the items may form part of a larger lot being manufactured and it is difficult to distinguish the progress of the individual item as it moves through the processing line. As the number of processing steps increase tracking becomes even more difficult. This is particularly a problem in the processing of wafers in a semiconductor processing plant.

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing or chemical vapor deposition, for example. Material stockers or stocking tools generally lie about the plant and store semiconductor wafers waiting to be processed. Each material stocker typically services two or more bays and can hold hundreds of cassettes. The wafers are usually stored in cassettes in groups of about 25 wafers. The wafers are then disposed within a carrier and move from one process to another in the carrier. The carriers are usually tracked by their carrier code by a computer system as they move through the plant.

Once a lot has been retrieved, and the equipment has been set up, the operation on the wafers by a particular piece of equipment, or "tool," can begin. At this point, the lot is "moved-in" to the operation. An operator on the line then communicates this information to the host computer. The lot remains in this state until the operation is completed. Once the operation is completed, the operator must perform tests and verifications on the wafers. When all tests and verifications have been performed, the host computer application program must be notified. Wafers may have moved from one cassette to another as a result of the operation; therefore the host application and computer has to be notified of these moves. The operator then places the cassette of "moved-out" wafers in the material stocker to await orders as to the location of the next piece of equipment that will perform operations on the wafers.

The semiconductor fabrication plant, including the bays, material stockers and the interconnecting path, typically operates under control of a distributed computer system running a factory management program. In this environment, the automated material handling system (AMHS) may conceptually include the cassettes, the transportation system (e.g., paths) and control system (e.g., the distributed computer system). An empty carriers management system as well as a separate test wafer management system may also form part of the AMHS.

Data gathered during the course of wafer processing is used to diagnose yield problems and forms the basis of yield improvement efforts. Such data includes parametric electrical test data gathered on individual circuits and test structures fabricated on the wafers, as well as wafer sort data which tests the suitability for use of the wafers once wafer processing is completed. One of the possible sources of yield variation is the order in which wafers in a lot are processed at a given processing step. When the processing is done one wafer at a time per step, a variation in yield may be caused by a build up of contaminants, uneven heating of a processing chamber or another physical aspect that changes during the processing of the lot. In a batch operation, the physical location of the wafer in the batch processing equipment may influence uniformity of the processing effects across the lot. In an example where wafers are moving through a contaminated chamber, if the order in which each wafer is processed is known then the final wafer yield may be plotted against the processing order in this step. For each wafer in a lot a drop-off in yield versus processing order would be observed due to the contamination problem. This data is used to make adjustments to the line to improve yield; however, this wafer tracking method lacks the level of precision in the data collected required by chip plants today.

In tracking the wafer processing order, specialized equipment has been used to read scribed wafer identifiers, either immediately prior to or after critical processing steps, and to store this data for later correlation with device performance. Randomizing the order of the wafers prior to such steps is often done to ensure effects are not compounded. The wafer positional data is fed into a computer system, the device performance metrics for a wafer lot of interest are manually entered, and then all possible graphs of the device metrics for that lot versus wafer processing order at each step are generated. The data is then reviewed to determine those steps at which the processing order may affect performance. This type of approach to tracking wafers can be costly in its implementation due to the amount of hardware and software needed to randomize the wafer order and interface with the wafer processing system's main computer database.

SUMMARY OF THE INVENTION

The present invention is directed to addressing the above and other needs in connection with improving traceability of wafers as they move through a multiple chamber process.

According to one aspect of the invention, it has been discovered that wafer tracking in a multiple chamber subsystem of a wafer processing system can be achieved by assigning individual wafers a set of positional coordinates each time the wafer moves within the cluster tool. It has also been discovered that the yield of successively processed wafers is improved by integrating into the processing system an in-situ feedback component for adjusting processing parameters of the previous processing chambers.

According to one aspect of the invention, a method of tracking wafers in a multiple chamber subsystem includes presenting a wafer into a first chamber and determining an angle of rotation of the wafer as the wafer moves into the first chamber and into a second chamber. The rotation angles and a corresponding chamber location of the wafer are then recorded as the wafer moves through each chamber of the multiple chamber subsystem.

According to another aspect of the invention, a method for detecting a processing deviation in a multiple chamber subsystem presenting a wafer into a first chamber and imparting an angle of rotation on the wafer as the wafer moves into each of the first and a second chamber. The angles of rotation for the wafer and the corresponding chamber location of the wafer are recorded as the wafer moves within the multiple chamber subsystem. The wafer is then analyzed for any deviations indicating a variance from the processing parameters.

In yet another aspect of the invention, a system for detecting a processing deviation in a multiple chamber subsystem includes a mechanical arm arrangement that presents a wafer into a first chamber. A rotator device imparts an angle of rotation on the wafer as the wafer moves into each of the first chamber and a second chamber. An analyzer arrangement analyzes the wafer for any deviations, such that the deviations indicate a variance of the processing parameters from the standard settings. A computer arrangement records the angles of rotation for the wafer and the corresponding chamber location of the wafer as the wafer moves within the multiple chamber subsystem. In a related embodiment, the computer arrangement is further adapted to correlate the wafer deviation, which manifests itself as a surface or structural wafer defect, to at least one of the chambers.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
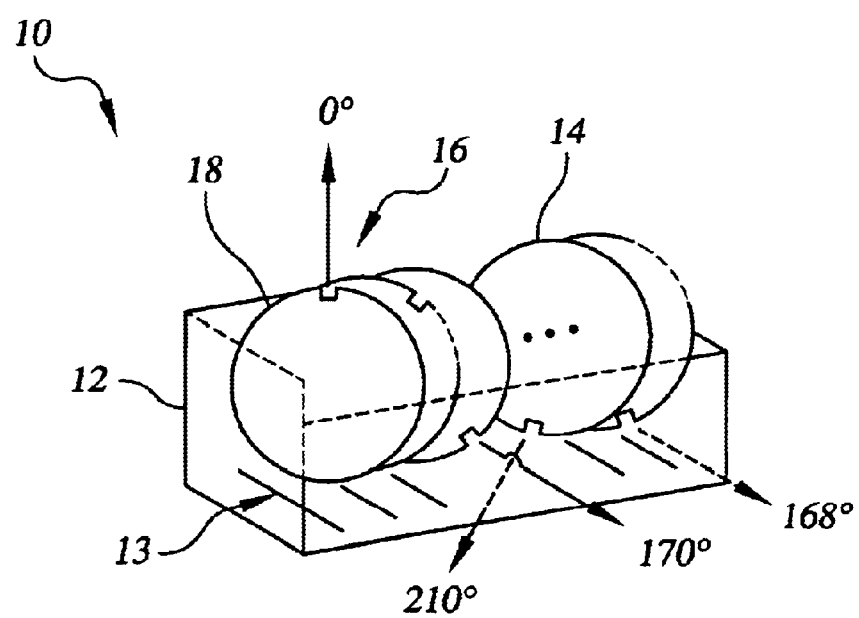
FIG. 1 is a carrier having a set of wafers arranged in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a method and system for tracking a wafer in a multiple chamber processing subsystem that forms part of a wafer processing line. The invention is particularly suited for finding deviations from the processing parameters that may manifest themselves as defects on the wafer surface or as defects in the wafer structure. While the present invention is not necessarily limited to a wafer processing application the invention will be better appreciated using a discussion of exemplary embodiments in such a specific context.

In an example embodiment, a method of tracking wafers in a multiple chamber wafer processing includes presenting a wafer into a first chamber of a multiple chamber subsystem (or cluster tool) and rotating the wafer to a certain angle of rotation. The rotation angle is either a predetermined angle increment every time, such as 10 degrees, or a random angle increment, so long as the rotation angle per wafer is tracked. As the wafer moves from one location to another within the cluster tool it is given a different angle of rotation and the wafer location is then recorded. The wafer coming out of the cluster tool is examined to determine if there are any deviations (or defects) that indicate that there was a variation in the processing parameters. Since the movement of the wafer through the cluster tool is mapped, the map is used as an analysis tool to locate the processing stage/location where the variation from the processing parameters occurred.

Referring now to the figures, FIG. 1 illustrates a wafer lot 10 arranged in a carrier 12 in accordance with one embodiment of the invention. Carrier 12 has a series of slots 13 that hold individual wafers 14 therein for movement through the wafer processing system. Wafers 14 have a slot or notch 16 located along the circumference that serves as a point of reference. In this example, slot 16 is at 0° degrees and serves as the starting point from which the wafer is rotated axially. The wafers are rotated to different angles of rotation at the onset of processing, with the increment of angle rotation being either predetermined or random. Where the wafers are rotated randomly, each wafer is to have a distinct angle of rotation before moving through the process. In a related embodiment, where individual wafer data is not desired and only wafer lot data is of interest, the wafers have the same initial angle of rotation at the onset of wafer processing. Each wafer can have about 360 angles of rotation, of 1-degree increments, excluding the slot portion and the scribe portion.

In other manufacturing applications, it is important to identify the axis of rotation of the object and the starting or reference point from which the angle of rotation will be measured. For example, where the object is a thin film display panel, the axis of rotation is similar to that of a wafer in that the panel is flat and acts as a substrate while its being processed. In one instance, the panel has about 4 main angles of rotation due to the panel's square shape.

Where the wafers are to be subjected to common process steps, such as heating in a furnace, the wafers are usually arranged in tubes. Since many tubes include up to 100 wafers, in this example each set of wafers is to have a distinct angle of rotation with respect to the adjacent wafer set. In a related example, each wafer has a distinct angle of rotation with respect to all of the wafers in the tube. Referring briefly to FIG. 1, each wafer also has a scribe or a code 18 located on the wafer for identifying the wafer. In addition, each carrier and cassette in the wafer processing system is also identified and tracked by an identification tag, such as a bar code, which is read by a sensor along the processing path.

Figure 2:
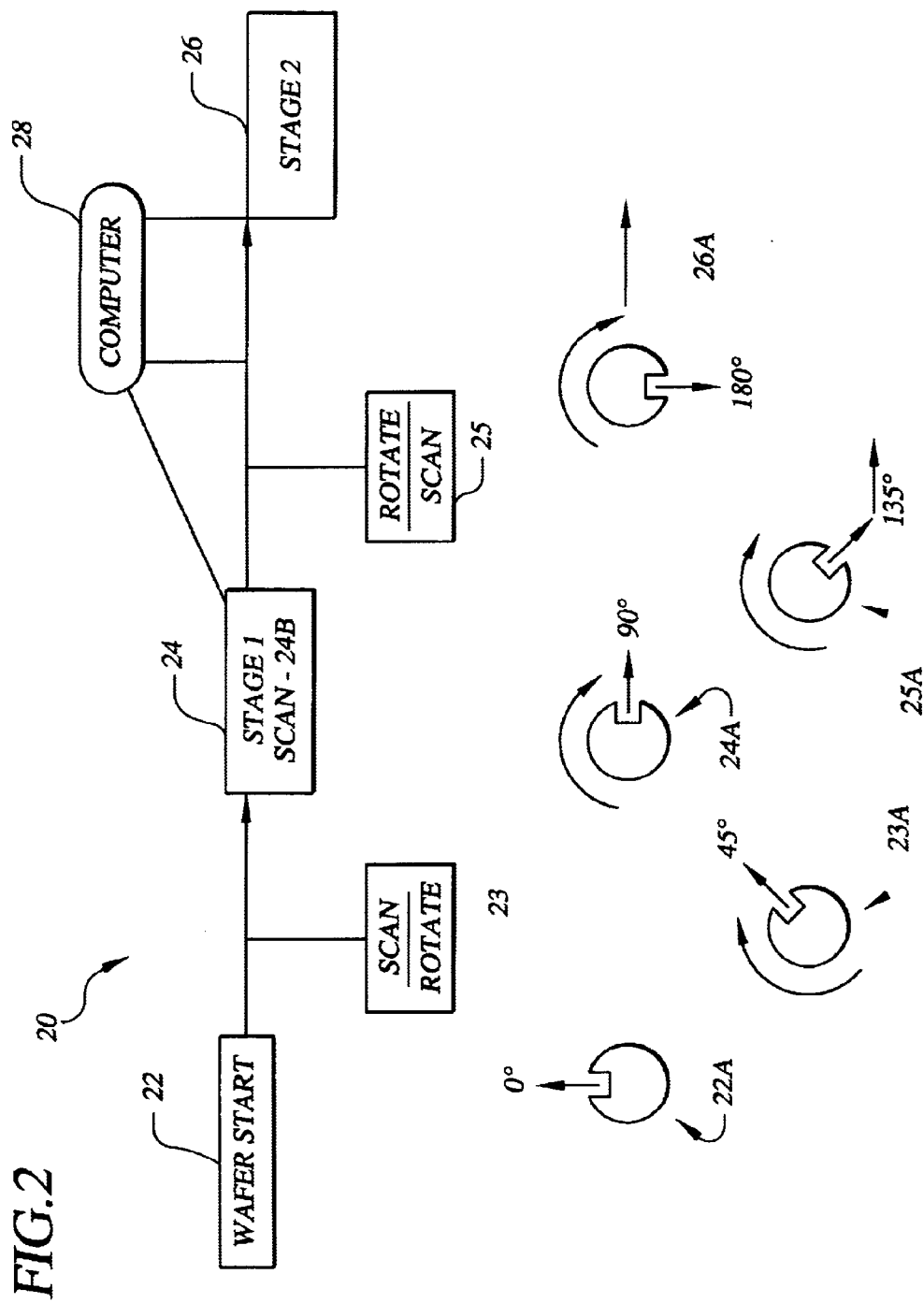
FIG. 2 is a process flow diagram of an example wafer processing line and the angles that the wafer is rotated to as the wafer moves through the processing line in accordance with one embodiment of the invention.

Referring now to FIG. 2, a process flow diagram exemplifies a wafer processing line 20 that has a computer arrangement coupled thereto. FIG. 2 also illustrates a wafer having different angles of rotation as it moves through the wafer process. The different angles of rotation correspond to the various steps of the process. At location 22, the wafer lot is started and wafer 22A has an initial angle of rotation of 0 degrees. The wafer is also identified at this point by its code and slot position in the carrier and this information is recorded in a computer arrangement 28. The movement of the wafer is tracked with this information and the successive angles of rotation are used to create a historical map of the movement of the wafer through the process.

In another embodiment, it is advantageous to impart an initial angle of rotation at 22A, either randomly or a predetermined angle. At location 23, the wafer is rotated to an angle of 45 degrees, now 23A, and scanned for identification. In this example, the rotation of the wafer is done with a wafer sorter that scans and sorts the wafers. The sorter identifies the wafer and the slot location and usually includes a robotic arm that imparts an angle of rotation on the wafer. The data that is generated after the scanning of the wafers is then recorded in the database of computer 28, with the computer being coupled to wafer processing line 20. Wafer 23A has an incoming angle of 45 degrees as it proceeds into the first stage of processing at location 24. A translation angle is added to the wafer due to the pick and place action (possibly by a robotic arm) that occurs as the wafer is removed from the carrier and placed into the first stage at location 24, resulting in wafer 24A. After the translation angle is added the wafer has an angle of rotation of 90 degrees. The wafer is scanned at 24B and the rotation angle is recorded in the computer database. Wafer 24A exits the first stage at location 24 and is again rotated another 45 degrees at location 25 to result in wafer 25A with an angle of rotation of 135 degrees. The new angle is scanned and recorded at computer 28 as the outgoing angle of the process. When the wafer moves into a second stage of processing at location 26 another translation angle is added to the wafer resulting in wafer 26A at 180 degrees.

Figure 3:
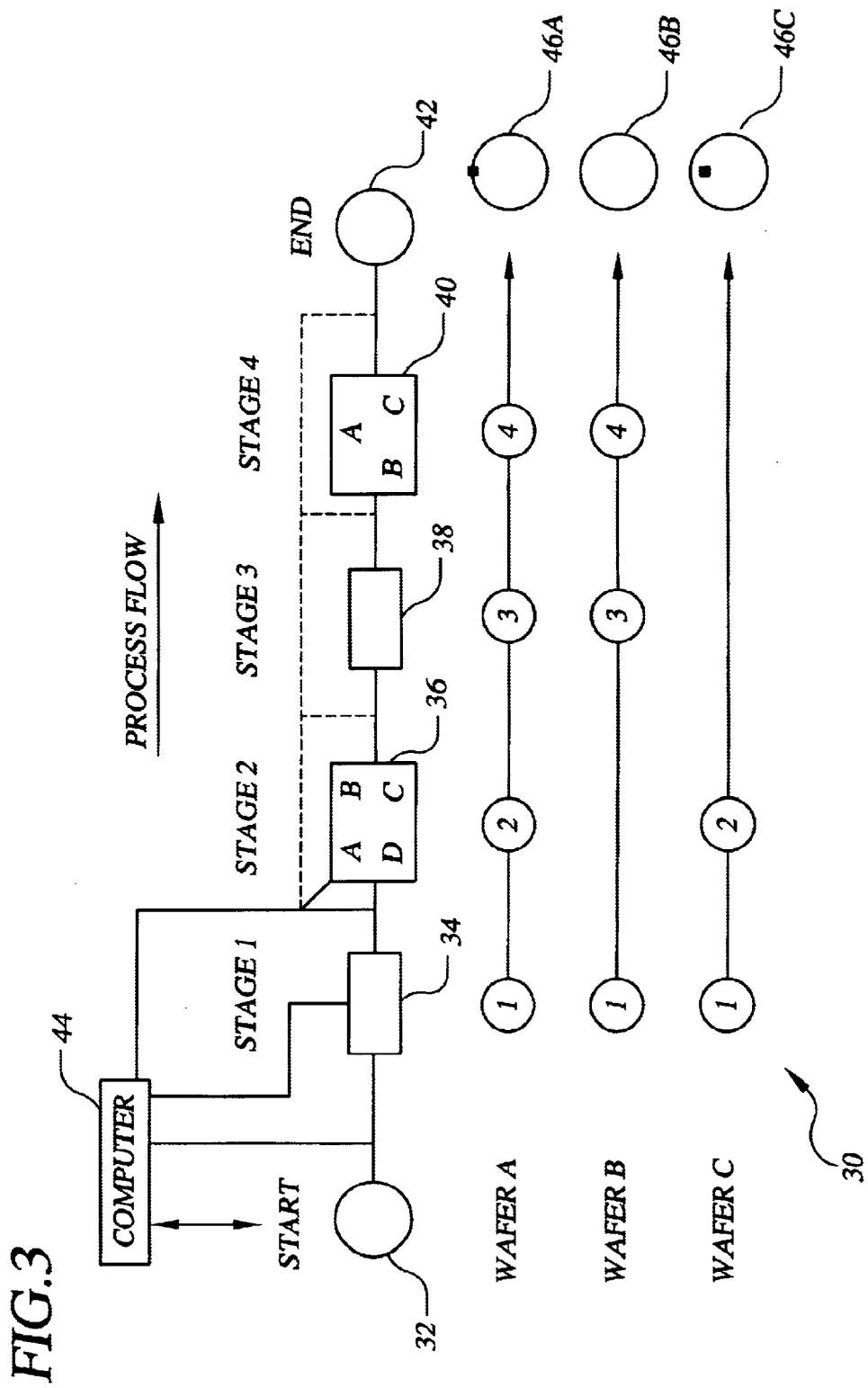
FIG. 3 is a process flow diagram of an example wafer processing line having multiple chamber stages in accordance with one embodiment of the invention.

Referring to FIG. 3, a process flow diagram exemplifies a wafer processing line 30 that has at least two stages or locations with cluster tools. Also illustrated are three wafers 46A, 46B and 46C that move through the processing line with different recipes. The wafer recipe dictates the path that the wafer follows in the processing line. Wafer processing starts at 32 and proceeds through four processing stages 34, 36, 38 and 40 before coming to an end at 42. A computer 44 is coupled to the processing line at about every point in the processing line in order to collect data on the movement of wafers in the system. Cluster tools 36 and 40 are composed of several chambers that perform subprocesses, such as metrology, wafer coating, and stepper exposure and film development. Computer 44 is coupled to these chambers and collects data as the wafer moves within the chambers of the tool. By way of example, wafer 46A moves through the process and, as dictated by the processing recipe (indicated by the steps that the wafer is exposed to) is exposed to each processing stage of processing line. In this example, angles of rotation are imparted upon every movement of wafer 46A through the processing line. The angle of rotation data and the corresponding processing stage, and tool, are recorded as data in the computer.

FIG. 3 is also representative of three wafers 46A, 46B and 46C (or wafer lots) that move through the processing line with different recipes. The wafer recipe dictates the path that the wafer follows in the processing line. Although each set of wafers is required to be processed according to its own processing recipe, the group of wafers can have a common processing stage that the wafers will move through. In one example, the wafers go through the common processing stage of being heated by a furnace while disposed in a tube holding about 100 wafers. The wafers are arranged such that each set of wafers has a different angle of rotation with respect to the adjacent set of wafers. In another example, each wafer in the tube has a different angle of rotation that is distinct from any other wafer. In a related example, the process includes a scanning device for verifying that the angle of rotation of the wafers are distinct from each other before proceeding through the line.

Wafers 46B and 46C also move through the processing line but follow different routes due to the type of processing recipe that is applied to the wafers. Wafer 46B is processed through stages 34, 38 and cluster tool 40. The external angle of rotation data for wafer 46B will differ from that of wafer 46C in that more angles of rotation are imparted due to the fact that more external processing steps are involved. However, with respect to internal processing steps, wafer 46C will have more rotation angles due to the number of chambers A–D at stage 36 in comparison to chambers A–C at stage 40. As a whole, the set of angles for wafer 46B versus wafer 46C is also different due to the different path taken during processing. In both cases, the angles of rotation are tied to the processing stage and tool. The resultant movement data is then recorded in computer 44 in order to create the historical movement map of each wafer.

In a related embodiment, in the second stage of processing, location 36 represents a multiple chamber subsystem (A–D) having a number of tools and subprocesses that a wafer is processed through. The multiple chamber subsystem has a number of tools and subprocess stages that impart additional angles of rotation on the wafer. The additional rotation angle data is also recorded as part of the mapping process. This is described further in connection with FIG. 4. In a related embodiment, one of the chambers includes a rotating table device that is used to create a balanced subprocess, such as wafer coating. The current invention integrates the rate of rotation of the table into the calculations of the angles of rotation and records this data in the movement map of the wafer. In a related embodiment, one of the chambers can include a rotating table device that is used to create a balanced subprocess. The current invention would integrate the rate of rotation into the calculations of the angles of rotation and record this data as well in the movement map of the wafer.

One example application of the present invention is the correlation of deviations in resultant wafers to determine the point in the process where the variance occurred in a process parameter. Wafer 46A and 46B illustrate wafers that have two curves lines, known as "smiles" (not shown), on the surface indicating that a deviation or, in this case, a defect has been caused by a processing stage or tooling. As another example, wafer 46A and wafer 46C have blemishes similarly located on the surface (dark spot on top), indicating that the wafer processing parameters have deviated or is out of tolerance. The external wafer movements are mapped as indicated above and can be used as a tool for correlating back through the process to find the process deviation. With the teachings of the present invention, the internal movements of a single wafer within the cluster tool can be tracked and later mapped. Table 1 is an example of the manner in which the data is collected and how the data is used to map the wafer movement with respect to the processing recipe.

TABLE 1

Wafer 46A Movement Map
WAFER 46A   CARRIER 1   SLOT 1

| Stage | Wafer I.D. | Chamber I.D. | Rotation Angle (degrees) | Processing Recipe |
|---|---|---|---|---|
| 36 | 100 | A | 10 | AC123 |
| 36 | 100 | C | 20 | AC123 |
| 36 | 200 | A | 10 | AB123 |
| 36 | 200 | B | 20 | AB123 |
| 36 | 300 | B | 10 | BCD123 |
| 36 | 300 | C | 20 | BCD123 |
| 36 | 300 | D | 30 | BCD123 |

Figure 4:
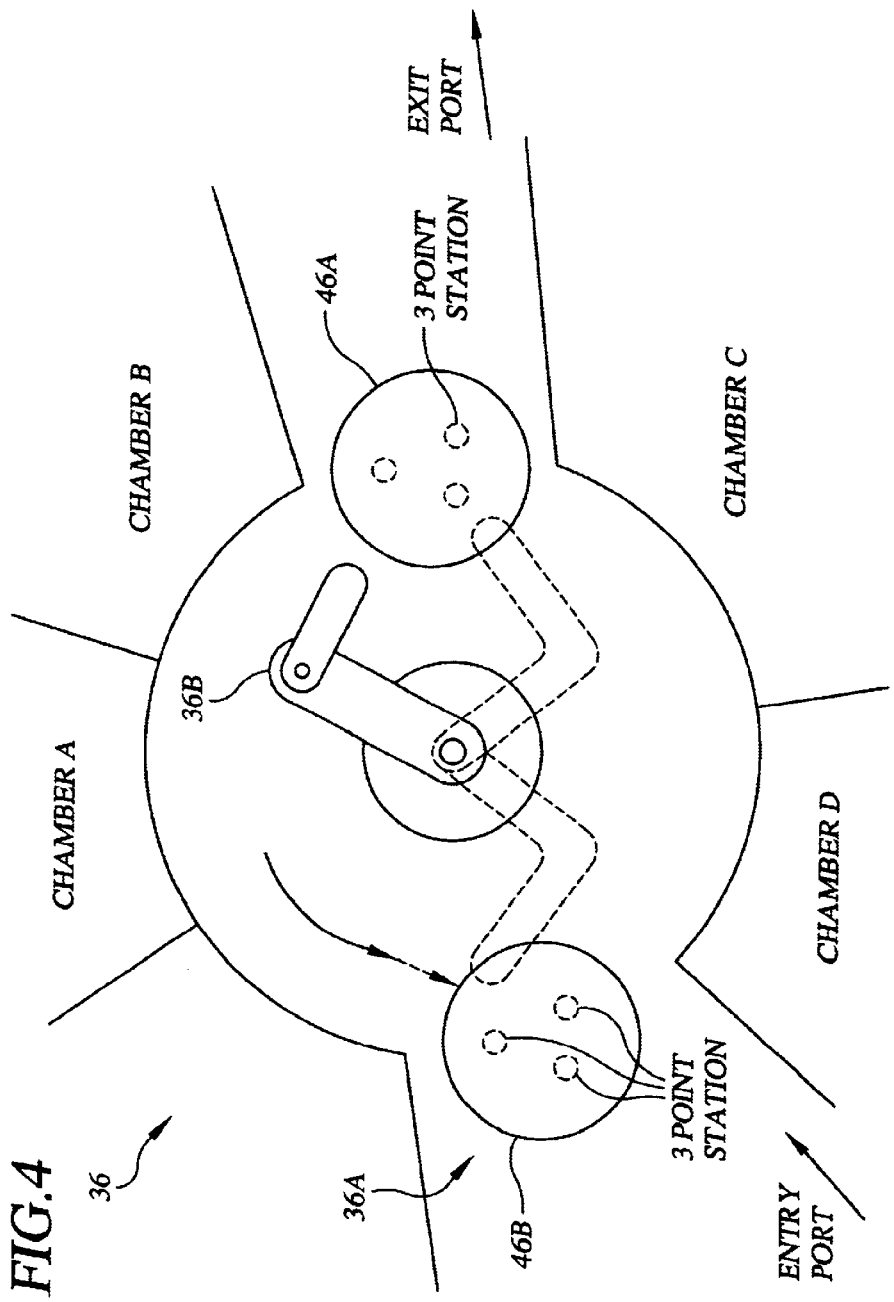
FIG. 4 is a diagram of an example multiple chamber location processing wafers in accordance with one embodiment of the invention.

FIG. 4 illustrates at processing stage 2 a four (4) chamber cluster tool 36 composed of chambers A–D that have several processing parameters. Wafer 46B is presented to cluster tool 36 via an entry port, as shown by the arrow, and is placed by a pick and place arm 36B on a three (3) point table 36A. An angle of rotation is imparted on wafer 46B either before moving into cluster tool 36 or before moving into chamber A. The rotation angle is set either randomly or to a predetermined angle by arm 36B. At the point that the wafer is rotated and placed into chamber A, the rotation angle, wafer I.D. and the chamber I.D. code are scanned and recorded into the computer. Capturing the wafer's movement within the cluster tool is achieved by developing a map from the data that is recorded as a set of coordinates (e.g. rotation angle, wafer chamber location). The wafer has an incoming angle into the chamber, a translation angle (caused by the pick and place arm) within the chamber and an outgoing angle as it is exiting the chamber before going into the succeeding chamber. FIG. 4 illustrates how wafer 46A moved through the cluster tool and how wafer 46B is being moved into the cluster tool.

In a related embodiment, the wafer movement within the cluster tool can be mapped not only in relation to its movement but also in relation to a recipe. Table 1 illustrates the movement of three wafers 100, 200 and 300. The chamber I.D. is recorded as well as the rotation angle and the particular recipe. In one example, wafer 100 moves from chamber A with a rotation angle of 10 degrees under recipe AC123 to chamber C with an angle of 20 degrees under recipe AC123. Wafer 200 has a similar movement but under recipe AB123, which includes chambers A and B. With respect to wafer 300, the recipe is BCD123 and the wafer moves through chambers B–D with different angles of rotation. Each line entry of the table is a set of coordinates that identifies a point in the process of where the wafer has traveled and to what processing stage and tool the wafer has been exposed. If a deviation arises in any of the wafers after exiting the cluster tool, the wafer movement map of Table 1 is used as a tool to correlate back through the multiple chamber subprocess to determine where the variance in the processing parameters occurred.

In yet another related embodiment, the wafer movement data collected similar to Table 1 is used in-situ as a feedback component to improve the yield of wafers. Real time adjustments are to the processing parameters going forward or back in the processing line (or the cluster tool) depending on the results of the present chamber processing on the wafer. In one example, chamber A involves a coating process that forms a layer coating that is too thin upon exiting the chamber. Using this information, the processing parameters of chamber B are adjusted to improve the overall wafer as it exits chamber B. Further, the processing deviation or variance information gathered from the wafer coming out of chamber A can be fed back into the computer in order to adjust the processing parameters before a succeeding wafer is processed. Processing deviations can be related back to the processing recipe to ensure that it is being followed. Any deviations can also indicate that predetermined angles of rotation that are being set on the wafer are not being consistently maintained due to some mechanical problem.

Figure 5:
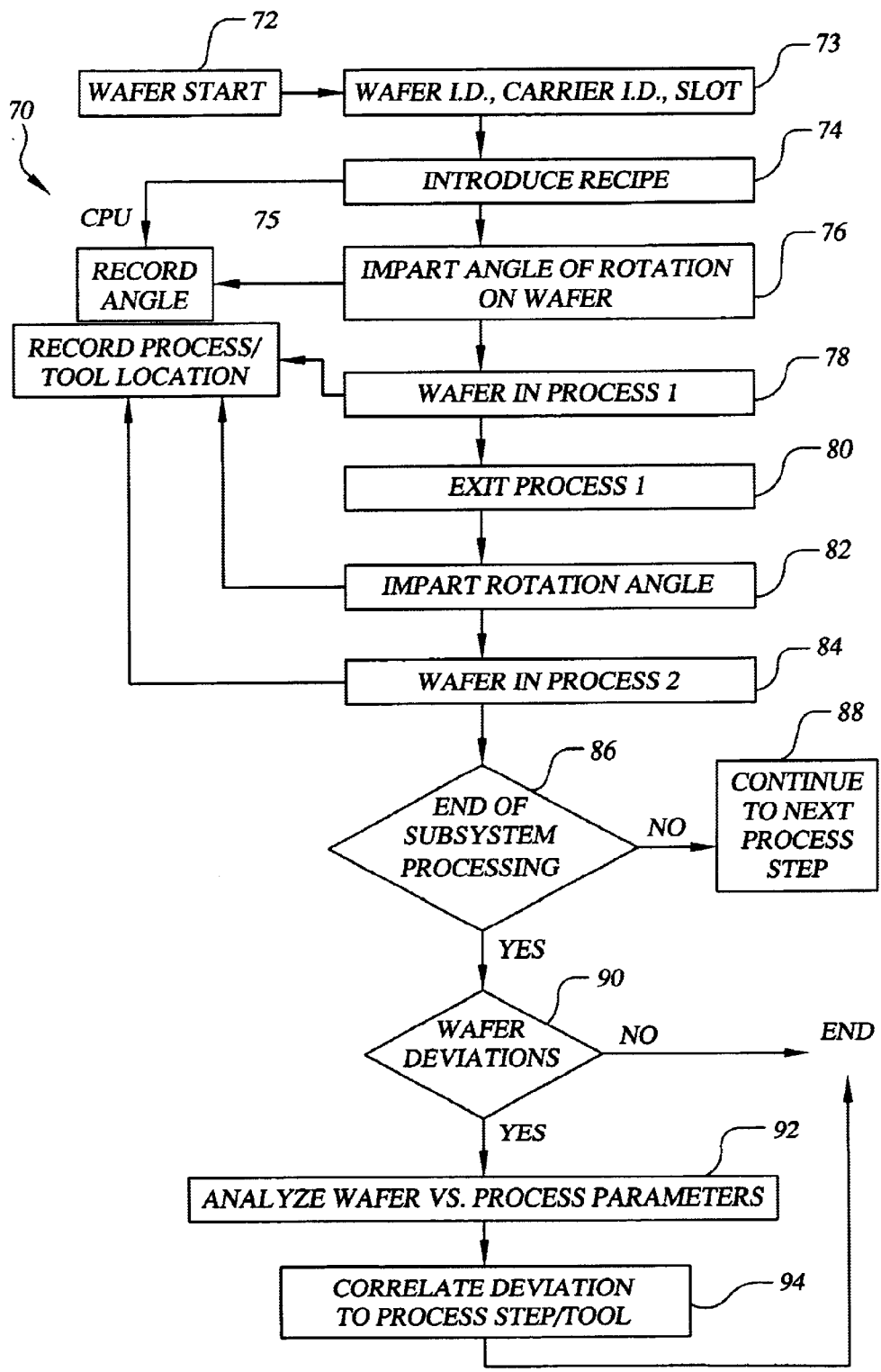
FIG. 5 is a flowchart of the manner in which wafers are tracked in a multiple chamber subsystem in accordance with one embodiment of the invention.

Referring to FIG. 5, flowchart 70 illustrates an example of the process flow of the method of tracking a wafer in a multiple chamber wafer processing system in accordance with an embodiment of the present invention. At 72, a wafer lot is presented into the first chamber of the cluster tool. At 73, the wafer's identification code, carrier code and slot number are identified and recorded in a computer. At 74, a processing recipe is introduced into the process as a whole and it is then recorded in computer arrangement 75. At 76, an initial angle of rotation is given to the wafer and recorded in the database of the computer. At 78, the wafer is presented into the first chamber, or in this example chamber A (see FIG. 4), and its location is recorded in computer 75. As the wafer is moved into the actual cluster tool processing location the physical action of picking up the wafer and placing it in chamber A imparts a translation angle. The translation angle is then defined and recorded at computer 75.

Once processing within the cluster tool is complete, a mechanical arm or rotating table rotates the wafer to give it an outgoing angle of rotation at 82 or after exiting chamber B at 84. The wafer then exits the chamber B and at 86 a decision is made whether the cluster tool processing is complete. If cluster tool processing is not complete, processing continues at 88 to another chamber as per the recipe. If cluster tool processing is complete, then an analysis is conducted at 90 on the wafer to determine if any deviations exist (such as wafer surface defects or part of the wafer structure is out of tolerance). If deviations do not exist on the wafer then the wafer continues on the normal processing path; this includes moving to Stage 3 of processing line 30 (FIG. 3). If deviations exist, then the wafer is analyzed more closely and, in this example, is analyzed in relation to the recipe at 92. At 94, the deviation is correlated back to the chamber and processing parameter that caused the deviation on the wafer using the historical movement map of one or various wafers that exhibit similar deviations or defects.

It is important that each movement of the wafer be recorded as a set of coordinates (e.g. rotation angle, corresponding wafer location in the system). The coordinates are then used in the development of the wafer movement map. Correlating the wafer deviation to at least one chamber and processing parameter includes using the computer to develop the historical wafer movement map composed of the coordinates. Using the coordinate data, the computer then subtracts each set of coordinates to arrive at the chamber location where the processing deviation (and defect) occurred.

In a related embodiment, the data is gathered real time and processed by the computer managing the wafer processing system. With the real time data adjustments are made to the processing parameters going forward or back in the process. This aspect immediately improves the yield of wafers coming out of the cluster tool and the entire processing line. In a related embodiment, additional aspects of the processing system include devices for conducting rotation angle verification on the wafer and devices for detecting the movement of a rotation table (or carrier movement) within the line. The system also includes a wafer sorter for sorting wafers and presenting the wafers into the processing system with an optional incoming angle of rotation.

In some parts of the process, it is advantageous to stop rotating the wafers, such as in the photolithography area, due to alignment issues. However, upon completion of this part of the process the wafers are returned to the angle of rotation that they had prior to arriving to the photolithography area and then moved on to the next processing stage. In a related embodiment, a control system is included that captures wafer-processing data from prior production runs. The control system data is then shared with the computer arrangement of the rotation system and used to make adjustments up and down the line to improve processing of wafers. For instance, the angles of rotation that are being imparted on the wafers change due to some change in conditions on the line. The change is either externally or internally driven, but the change is now manageable with a feedback control loop that is integrated into the processing system. Adjustments to the processing parameters within the chambers can be made based on what was learned from prior production runs. In another example, the wafers are rotated axially to a defined area of the wafer that needs to be processed in a specified manner.

As noted above, the present invention is applicable to tracking wafers that are being processed. Further the present invention improves wafer production yield by integrating a feedback component that adjusts the processing parameters of the cluster tool and/or the entire wafer processing system. Accordingly, the present invention is not to be necessarily limited to the particular examples described above, but is intended to cover all aspects of the invention as fairly set out in the attached claims. For instance, while the rotation and tracking of wafers in a cluster tool is illustrated, other positional adjustments may be made to various objects during processing. These adjustments can lead to improvements in the product, in the manufacturing process or in the yield of product. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of tracking wafers in a multiple chamber subsystem of a wafer processing system having at least two processing parameters, the method comprising:
   presenting a wafer into a first chamber;
   determining respective first and second angles of rotation of the wafer as the wafer moves into the first chamber and subsequently into a second chamber; and
   recording the second rotation angle relative to the first angle of rotation and a corresponding chamber location of the wafer as the wafer moves through each chamber of the multiple chamber subsystem.

2. The method of claim 1, wherein the step of determining the rotation angles includes the steps of:
   rotating the wafer to an angle of rotation that is selected from the group consisting of an incoming, a translation and an outgoing angle of rotation; and
   measuring the angle of rotation.

3. The method of claim 1, wherein the step of recording the second rotation angle includes using a computer arrangement to develop a historical wafer movement map composed of a plurality of sets of coordinates, each set of coordinates including the angle of rotation and the corresponding chamber location of the wafer in the multiple chamber subsystem.

4. The method of claim 1, further including the step of correlating a wafer deviation to a processing parameter and to at least one chamber.

5. The method of claim 4, further including the steps of:
   generating data on the wafer deviation and on variance of the processing parameters after the wafer exits the first chamber; and
   using the generated data to adjust the processing parameters of the second chamber before the wafer is moved into the second chamber.

6. The method of claim 5, further including the step of using the generated data to adjust the processing parameters of the first chamber before a second wafer is moved into the first chamber.

7. The method of claim 4, wherein the step of correlating the wafer deviation to at least one chamber includes using a computer arrangement to:
   develop a historical wafer movement map composed of a plurality of sets of coordinates, each set of coordinates including the angle of rotation and the corresponding chamber location of the wafer in the subsystem, and
   subtract each set of coordinates to arrive at the at least one chamber.

8. The method of claim 1, further including the steps of:
   applying a processing recipe to the wafer; and
   analyzing the wafer in relation to the processing recipe to determine the existence of a variance from the recipe.

9. The method of claim 8, further including the steps of:
   generating data on wafer deviation and on the variance from the recipe after the wafer exits the first chamber;
   using the generated data to adjust the processing recipe of the second chamber before the wafer is moved into the second chamber; and
   using the generated data to adjust the processing recipe of the first chamber before a second wafer is moved into the first chamber.

10. The method of claim 1, further including the step of rotating the wafer axially to a defined area of the wafer during processing.

11. A system for tracking wafers in a multiple chamber subsystem of a wafer processing system having at least two processing parameters, the system comprising:
   means for presenting a wafer into a first chamber;
   means for determining respective first and second angles of rotation of the wafer as the wafer moves into the first chamber and subsequently into a second chamber; and
   means for recording the second rotation angle relative to the first angle of rotation and a corresponding chamber location of the wafer as the wafer moves through each chamber of the multiple chamber subsystem.

12. The system of claim 11, further including:
   means for applying a processing recipe to the wafer; and
   means for analyzing the wafer in relation to the recipe to determine the existence of a variance from the recipe.

13. A method for detecting a processing deviation in a multiple chamber subsystem of a wafer processing system, the subsystem having at least two processing parameters, the method comprising:
   presenting a wafer into a first chamber;
   imparting an angle of rotation on the wafer as the wafer is moved into each of the first and a second chamber;
   recording the angles of rotation for the wafer and the corresponding chamber location of the wafer in the multiple chamber subsystem; and analyzing the wafer for any deviations indicating a variance of the processing parameters.

14. The method of claim 13, further including the step of correlating the processing deviation to at least one of the chambers of the subsystem.

15. The method of claim 14, wherein the step of correlating the wafer deviation to at least one chamber includes using a computer arrangement to:
    develop a historical wafer movement map composed of a plurality of sets of coordinates, each set of coordinates including the angle of rotation and the corresponding chamber location of the wafer in the subsystem, and
    subtract each set of coordinates to arrive at the at least one chamber.

16. The method of claim 13, further including the steps of:
    generating data on any wafer deviation and on the variance from the processing parameters after the wafer exits the first chamber; and
    using the generated data to adjust the processing parameters of the second chamber before the wafer is moved into the second chamber.

17. The method of claim 16, further including the step of using the generated data to adjust the processing parameters of the first chamber before a second wafer is moved into the second chamber.

18. The method of claim 13, wherein the step of recording rotation angles includes using a computer arrangement to develop a historical wafer movement map composed of a plurality of sets of coordinates, each set of coordinates including the angle of rotation and the corresponding chamber location of the wafer in the subsystem.

19. The method of claim 13, wherein the angle of rotation of the wafer is selected from the group consisting of a predetermined angle and a random angle.

20. The method of claim 13, wherein the angle of rotation include an incoming angle, a translation angle and an outgoing angle of rotation.

21. The method of claim 13, further including the steps of:
    applying a processing recipe to the wafer; and
    analyzing the wafer in relation to the processing recipe to determine the existence of a variance from the recipe.

22. The method of claim 21, further including the steps of:
    generating data on any wafer deviation and on the variance from the recipe after the wafer exits the first chamber; and
    using the generated data to adjust the processing recipe of the second chamber before the wafer is moved into the second chamber.

23. The method of claim 22, further including the step of using the generated data to adjust the processing recipe of the first chamber before a second wafer is moved into the first chamber.

24. A system for detecting a processing deviation in a multiple chamber subsystem of a wafer processing system, the subsystem having at least two processing parameters, the system comprising:
    means for presenting a wafer into a first chamber;
    means for imparting an angle of rotation on the wafer as the wafer moves into each of the first and a second chamber;
    means for recording the angles of rotation for the wafer and the corresponding chamber location of the wafer as the wafer moves through each chamber of the multiple chamber subsystem; and
    means for analyzing the wafer for any deviations indicating a variance from the processing parameters.

25. A system for detecting a processing deviation in a multiple chamber subsystem of a wafer processing system, the subsystem having at least two processing parameters, the system comprising:
    a mechanical arm that presents a wafer into a first chamber;
    a rotating device for imparting an angle of rotation on the wafer as the wafer moves into each of the first and a second chamber;
    an analyzer arrangement that analyzes the wafer for any deviations indicating a variance from the processing parameters; and
    a computer arrangement adapted to record the angles of rotation for the wafer and the corresponding chamber location in the subsystem.

26. The system of claim 25, wherein the computer arrangement is further adapted to correlate the wafer deviation to at least one of the chambers.

27. The system of claim 26, further including a control system that is coupled to the computer arrangement and that shares wafer processing data generated from prior production runs for use in the correlation analysis.

28. The system of claim 25, further including a sorting apparatus for identifying the wafer and presenting the wafer with an incoming angle of rotation.

29. A system for detecting a processing deviation in a multiple chamber subsystem of a wafer processing system, the subsystem having at least two processing parameters, the system comprising:
    a mechanical arm that presents a wafer into a first chamber;
    a rotating device for imparting an angle of rotation on the wafer as the wafer moves into each of the first and a second chamber;
    an analyzer arrangement that analyzes the wafer for any deviations indicating a variance from the processing parameters;
    a computer arrangement adapted to record the angles of rotation for the wafer and the corresponding chamber location in the subsystem and further adapted to correlate the wafer deviation to at least one of the chambers; and
    a wafer carrier movement detector for determining the rate of rotation of a carrier moving from the first chamber to the second chamber, wherein the movement detector data is recorded and incorporated into correlation analysis performed by the computer arrangement.

* * * * *